US012794337B2

(12) United States Patent
Miyata et al.

(10) Patent No.: US 12,794,337 B2
(45) Date of Patent: Nov. 10, 2026

(54) POWER CONVERSION DEVICE WITH FAULT DETECTION OF A PHASE CURRENT DIFFERENCE

(71) Applicant: Hitachi Astemo, Ltd., Hitachinaka (JP)

(72) Inventors: Yuji Miyata, Hitachinaka (JP); Yuta Nakamura, Hitachinaka (JP); Masatoshi Goto, Hitachinaka (JP); Kazunari Kurokawa, Hitachinaka (JP); Yoshinori Sagiya, Hitachinaka (JP); Takuma Kato, Hitachinaka (JP); Kazuya Nagasawa, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 399 days.

(21) Appl. No.: 18/565,129

(22) PCT Filed: May 31, 2021

(86) PCT No.: PCT/JP2021/020656
§ 371 (c)(1),
(2) Date: Jul. 16, 2024

(87) PCT Pub. No.: WO2022/254508
PCT Pub. Date: Dec. 8, 2022

(65) Prior Publication Data

US 2024/0413750 A1 Dec. 12, 2024

(51) Int. Cl.
*H02M 1/32* (2007.01)
*G01R 19/00* (2006.01)
(Continued)

(52) U.S. Cl.
CPC ...... *H02M 1/0009* (2021.05); *G01R 19/0038* (2013.01); *H02H 3/33* (2013.01); *H02M 1/32* (2013.01); *H02M 3/1586* (2021.05)

(58) Field of Classification Search
CPC ........ H02H 3/33; H02M 1/0009; H02M 1/32; H02M 3/1586
See application file for complete search history.

(56) References Cited

U.S. PATENT DOCUMENTS

2017/0288593 A1* 10/2017 Suzuki .................... B60L 3/003
2017/0331278 A1* 11/2017 Weilbier ................ H02H 7/045
(Continued)

FOREIGN PATENT DOCUMENTS

CN 110677038 A 1/2020
CN 112335164 A 2/2021
(Continued)

OTHER PUBLICATIONS

Machine translation of WO 2013038512 by Clarivate Analytics, Feb. 2026, 19 pages.*
(Continued)

*Primary Examiner* — Harry R Behm
(74) *Attorney, Agent, or Firm* — CANTOR COLBURN LLP

(57) ABSTRACT

The purpose of the present invention is to provide a power conversion device capable of further decreasing, compared to the prior art, misdetection of failures in a chopper circuit which constitutes phases. In order to achieve the foregoing, the present invention comprises: a multi-phase transformer circuit in which a plurality of chopper circuits are connected in parallel according to the number of phases; a drift detection unit which detects drift in a phase current in each chopper circuit; and a failure detection unit which variably sets a failure threshold value according to a state quantity of the chopper circuit, and which detects a failure in the chopper circuit by comparing the drift with the failure threshold value.

10 Claims, 4 Drawing Sheets

(51) Int. Cl.
*H02H 3/33* (2006.01)
*H02M 1/00* (2006.01)
*H02M 3/158* (2006.01)

(56) References Cited

U.S. PATENT DOCUMENTS

2020/0007027 A1 1/2020 Fujioka et al.
2021/0159799 A1 5/2021 Suzuki et al.

FOREIGN PATENT DOCUMENTS

WO WO-2013038512 A1 * 3/2013 .......... H02M 3/1584
WO 2019244614 A1 12/2019

OTHER PUBLICATIONS

International Search Report for International Application No. PCT/JP2021/020656; Mailing Date, Aug. 10, 2021; 4 pages.
PCT Written Opinion of the International Searching Authority for International Application No. PCT/JP2021/020656; Date of Mailing, Aug. 10, 2021; 6 pages.
SIPO The First Office Action for corresponding CN Application No. 202180098743.5; Issued Mar. 26, 2026.

* cited by examiner

POWER CONVERSION DEVICE WITH FAULT DETECTION OF A PHASE CURRENT DIFFERENCE

CROSS REFERENCE TO RELATED APPLICATIONS

This is the U.S. national stage of application No. PCT/JP2021/020656, filed on May 31, 2021. Priority of which is claimed and the disclosure of which is also incorporated herein by reference.

TECHNICAL FIELD

The present invention relates to a power conversion device.

BACKGROUND ART

Patent Document 1 described below is a power conversion device that includes a polyphase converter in which a plurality of chopper circuits each including a switching element and a reactor connected to the switching element are connected in parallel, and describes a power conversion device that includes a single current sensor that is provided on a primary side of the chopper circuit and detects a phase current flowing to each reactor in both an on state and an off state of each switching element, and a drift current detection unit that detects a drift current of a phase current in each chopper circuit on the basis of the phase current detected by the current sensor.

CITATION LIST

Patent Document

[Patent Document 1]
PCT International Publication No. WO 2019/244614

SUMMARY OF INVENTION

Technical Problem

Incidentally, since the conventional power conversion device described above detects the drift current of the phase current by comparing peaks of the phase current of each chopper circuit, when the phase current becomes small, a detection accuracy of the drift current decreases. Then, as a result, a risk of erroneous detection of a failure in a chopper circuit (multiphase transformer circuit) having a multiphase configuration increases.

The present invention has been made in view of the circumstances described above, and an object of the present invention is to provide a power conversion device that can reduce erroneous detection of failures in a multiphase transformer circuit compared with in the prior art.

Solution to Problem

A power conversion device of a first aspect of the present disclosure includes a multiphase transformer circuit in which a plurality of chopper circuits are connected in parallel according to the number of phases, a current sensor configured to detect a phase current of the chopper circuit, a drift current detection unit configured to detect a drift current value of the phase current, and a failure determination unit configured to variably set a failure detection threshold value according to a state amount of the multiphase transformer circuit and to determine a failure of the chopper circuit by comparing the drift current value with the failure detection threshold value.

In the power conversion device according to a second aspect of the present disclosure, the current sensor may detect a total amount of the phase current, and the failure determination unit may set the failure detection threshold value on the basis of the state amount obtained from the total amount.

The power conversion device according to a third aspect of the present disclosure further includes a second current sensor configured to detect an input current or output current of the multiphase transformer circuit instead of the current sensor, in which the failure determination unit may set the failure detection threshold value on the basis of a detection value of the second current sensor.

In the power conversion device according to a fourth aspect of the present disclosure, the failure determination unit may divide a current range into a plurality of current ranges according to a size of the state amount and set the failure detection threshold value for each division.

The power conversion device according to a fifth aspect of the present disclosure may also further include a failure identification unit configured to identify the chopper circuit with a failure.

In the power conversion device according to a sixth aspect of the present disclosure, the failure identification unit may include a plurality of temperature sensors that each detect a temperature of a semiconductor switching element constituting the chopper circuit, and a determination unit configured to determine the semiconductor switching element with a failure on the basis of a detection value of the temperature sensor.

In the power conversion device according to a seventh aspect of the present disclosure, the failure determination unit may set the failure detection threshold value to be smaller as the state amount decreases.

In the power conversion device according to an eighth aspect of the present disclosure, the state amount may be an average value or an effective value of the phase current.

In the power conversion device according to a ninth aspect of the present disclosure, the state amount is a voltage transformation ratio of the multiphase transformer circuit.

In the power conversion device according to a tenth aspect of the present disclosure, the multiphase transformer circuit may be a step-up or step-down conversion circuit with a multiphase configuration.

Advantageous Effects of Invention

According to the present disclosure, it is possible to provide a power conversion device that can reduce erroneous detection of failures in multiphase transformer circuits compared with in the prior art.

DESCRIPTION OF EMBODIMENTS

Hereinafter, embodiments of the present disclosure will be described with reference to the drawings.

First Embodiment

Figure 1:
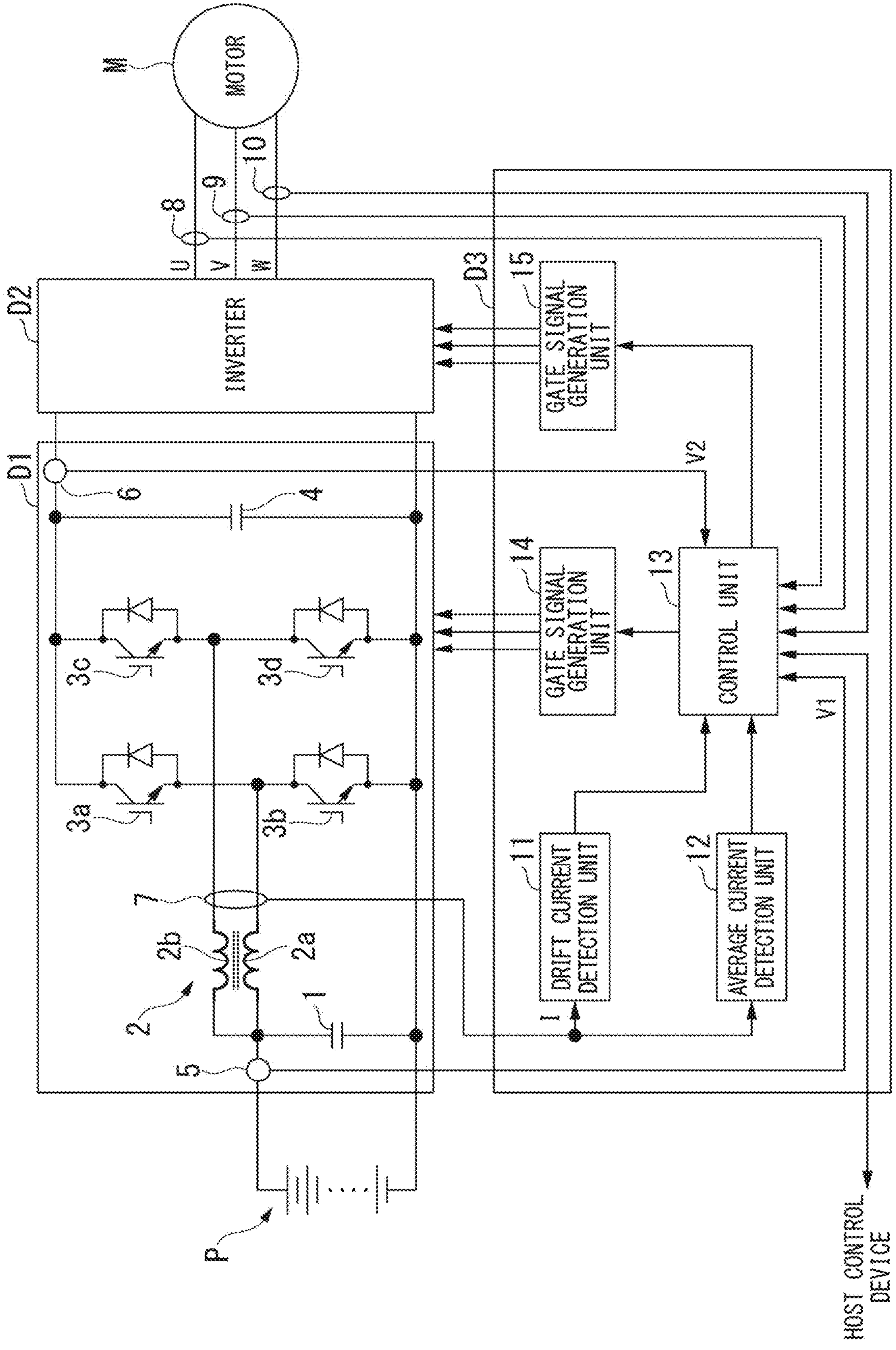
FIG. 1 is a block diagram which shows an overall configuration of a power conversion device A according to a first embodiment of the present disclosure.

First, a first embodiment of the present disclosure will be described with reference to FIGS. 1 to 3. The power conversion device A according to the first embodiment is provided between a battery pack P and a traveling motor M as shown in FIG. 1 and is a device that mutually converts DC power and three-phase AC power. This power conversion device A includes a step-up or step-down converter D1, an inverter D2, and a control drive circuit D3 as shown in FIG. 1. Such a power conversion device A is installed, for example, in an electric vehicle such as a hybrid vehicle or an electric vehicle.

Here, the battery pack P has a positive electrode connected to a primary side input terminal of the step-up or step-down converter D1, and a negative electrode connected to a primary side GND terminal of the step-up or step-down converter D1. This battery pack P is a secondary battery such as a lithium-ion battery and performs charging and discharging with DC power.

The traveling motor M is a three-phase synchronous motor that generates traveling power for an electric vehicle and is a load of the inverter D2. This traveling motor M is rotationally driven by three-phase drive power (U-phase drive power, V-phase drive power, and W-phase drive power) input from the inverter D2 and rotates drive wheels of the electric vehicle.

The power conversion device A according to the first embodiment is provided between such a battery pack P and a motor M, and has a power running function that converts DC power supplied from the battery pack P into three-phase AC power to drive the motor M and a charging function that converts regenerated power (three-phase AC power) of the motor M into DC power to supply it to the battery pack P.

Note that, among the step-up or step-down converter D1, the inverter D2, and the control drive circuit D3 that constitute such a power conversion device A, the step-up or step-down converter D1 is a component corresponding to a multiphase transformer circuit of the present disclosure, and the control drive circuit D3 is a component corresponding to a drift current detection unit and a failure determination unit of the present disclosure.

The step-up or step-down converter D1 is a step-up or step-down conversion circuit with a multiphase configuration called a magnetically coupled interleaved chopper circuit, and includes a first capacitor 1, a transformer 2, and four insulated gate bipolar transistors (IGBT) for voltage transformation 3*a* to 3*d*, a second capacitor 4, a primary voltage sensor 5, a secondary voltage sensor 6, and a current sensor 7 as shown in FIG. 1.

This step-up or step-down converter D1 is a power conversion circuit that steps up or steps down the DC power to perform an input or an output on the basis of a gate signal for voltage transformation input from the control drive circuit D3. That is, this step-up or step-down converter D1 selectively performs a step-up operation of stepping up the DC power input to the primary side from the battery pack P and outputting it to the inverter D2, and a step-down operation of stepping down the DC power input from the inverter D2 and outputting it to the battery pack P.

The inverter D2 is equipped with three switching legs (total 6 traveling IGBTs) corresponding to 3 phases, and each traveling IGBT is turned on or off on the basis of the traveling gate signal input from the control drive circuit D3, and thereby power conversion between DC power and three-phase AC power is performed. That is, this inverter D2 selectively performs a power operation of converting DC power input from the step-up or step-down converter D1 into three-phase AC power and supplying it to the travelling motor M, and a regeneration operation of converting three-phase AC power input from the traveling motor M to DC power and outputting it to the step-up or step-down converter D1.

Here, when the step-up or step-down converter D1 is described in more detail, the first capacitor 1 has one end connected to a positive electrode of the battery pack P and the transformer 2, and the other end connected to the positive electrode of the battery pack P. Both ends of the first capacitor 1 are primary side input and output terminals of the step-up or step-down converter D1.

That is, this first capacitor 1 is connected in parallel to the battery pack P, removes high frequency noise that may be included in the DC power (battery power) input from the battery pack P to the step-up or step-down converter D1 during the step-up operation, and smooths ripples included in the DC power input from the transformer 2 during the step-down operation.

The transformer 2 includes a primary winding 2*a* and a secondary winding 2*b*, and one end of the primary winding 2*a* and one end of the secondary winding 2*b* are connected to one end of the first capacitor 1. The other end of the primary winding 2*a* is connected to an emitter terminal of a first IGBT for voltage transformation 3*a* and a collector terminal of a second IGBT for voltage transformation 3*b*, and the other end of the secondary winding 2*b* is connected to an emitter terminal of a third IGBT for voltage transformation 3*c* and a collector terminal of a fourth IGBT for voltage transformation 3*d*.

In such a transformer 2, the primary winding 2*a* and the secondary winding 2*b* are electromagnetically coupled by a predetermined coupling coefficient k. That is, the primary winding 2*a* has a predetermined first self-inductance La according to the number of windings or the like thereof, and the secondary winding 2*b* has a predetermined second self-inductance Lb according to the number of windings or the like thereof. Moreover, the primary winding 2*a* and the secondary winding 2*b* have mutual inductance based on the first self-inductance La, second self-inductance Lb, and coupling coefficient k described above.

Among the four IGBTs for voltage transformation 3*a* to 3*d*, the first IGBT for voltage transformation 3*a* and the second IGBT for voltage transformation 3*b* constitute an A-phase switching leg in the step-up or step-down converter D1. In addition, the third IGBT for voltage transformation 3*c* and the fourth IGBT for voltage transformation 3*d* constitute a B-phase switching leg in the step-up or step-down converter D1. The A-phase switching leg and the B-phase switching leg are switching arms that are turned on or off in opposite phases to each other.

The first IGBT for voltage transformation 3*a* is an upper arm switch in the A-phase switching leg, and the second IGBT for voltage transformation 3*b* is a lower arm switch in the A-phase switching leg. Moreover, the third IGBT for voltage transformation 3*c* is an upper arm switch in the B-phase switching leg, and the fourth IGBT for voltage transformation 3*d* is a lower arm switch in the B-phase switching leg.

The first IGBT for voltage transformation 3*a* has a collector terminal commonly connected to a collector terminal of the third IGBT for voltage transformation 3*c* and one end of the second capacitor 4, an emitter terminal commonly connected to the other end of the primary winding 2*a* and a collector terminal of the second IGBT for voltage transformation 3*b*, and a gate terminal connected to the first output terminal for voltage transformation of the control drive circuit D3. Such a first IGBT for voltage transformation 3*a* is a semiconductor switching element whose on or off duty ratio is controlled on the basis of the first gate signal for voltage transformation input from the first output terminal for voltage transformation.

The second IGBT for voltage transformation 3*b* has a collector terminal commonly connected to the other end of the primary winding 2*a* and the emitter terminal of the first IGBT for voltage transformation 3*a*, an emitter terminal commonly connected to an emitter terminal of the fourth IGBT for voltage transformation 3*d*, the other end of the first capacitor 1, and the other end of the second capacitor 4, and a gate terminal connected to the second output terminal for voltage transformation of the control drive circuit D3. The second IGBT for voltage transformation 3*b* is a semiconductor switching element whose on or off duty ratio is controlled on the basis of the second gate signal for voltage transformation input from the second output terminal for voltage transformation.

The third IGBT for voltage transformation 3*c* has a collector terminal commonly connected to the collector terminal of the first IGBT for voltage transformation 3*a* and one end of the second capacitor 4, an emitter terminal commonly connected to the other end of the secondary winding 2*b* and the collector terminal of the fourth IGBT for voltage transformation 3*d*, and a gate terminal connected to the third output terminal for voltage transformation of the control drive circuit D3. The third IGBT for voltage transformation 3*c* is a semiconductor switching element whose on or off duty ratio is controlled on the basis of the third gate signal for voltage transformation input from the third output terminal for voltage transformation.

The fourth IGBT for voltage transformation 3*d* has a collector terminal commonly connected to the other end of the secondary winding 2*b* and the emitter terminal of the third IGBT for voltage transformation 3*c*, an emitter terminal commonly connected to the emitter terminal of the first IGBT for voltage transformation 3*a*, the other end of the first capacitor 1, and the other end of the second capacitor 4, and a gate terminal connected to the fourth output terminal for voltage transformation of the control drive circuit D3. The fourth IGBT for voltage transformation 3*d* is a semiconductor switching element whose on or off duty ratio is controlled on the basis of the fourth gate signal for voltage transformation input from the fourth output terminal for voltage transformation.

The first to fourth IGBTs for voltage transformation 3*a* to 3*d* each include a freewheeling diode as shown in FIG. 1. That is, for each IGBT, this freewheeling diode has a cathode terminal connected to a collector terminal, and an anode terminal connected to an emitter terminal. Such a freewheeling diode allows a freewheeling current to flow from the anode terminal to the cathode terminal when the IGBT is in an OFF state.

The second capacitor 4 has one end connected to the collector terminal of the first IGBT for voltage transformation 3*a* and the collector terminal of the third IGBT for voltage transformation 3*c*, and the other end commonly connected to the emitter terminal of the second IGBT for voltage transformation 3*b*, the emitter terminal of the fourth IGBT for voltage transformation 3*d*, and the other end of the first capacitor 1. Both ends of the second capacitor 4 are secondary input and output terminals of the step-up or step-down converter D1.

Such a second capacitor 4 smooths ripples that may be included in the DC power (stepped-up power) input from the A-phase switching leg and the B-phase switching leg during the step-up operation. In addition, the second capacitor 4 smooths ripples that may be included in the DC power (regenerated power) input from the inverter D2 during a voltage step-down operation.

Here, among the first capacitor 1, the primary winding 2*a* and secondary winding 2*b* of the transformer 2, the four insulated gate bipolar transistor (IGBTs) for voltage transformation 3*a* to 3*d*, and the second capacitor 4, the first capacitor 1, the primary winding 2*a*, the first and second IGBT for voltage transformation 3*a* and 3*b* (A-phase switching leg), and the second capacitor 4 constitute a first chopper circuit.

In addition, the first capacitor 1, the secondary winding 2*b*, the third and fourth IGBTs for voltage transformation 3*c* and 3*d* (B-phase switching leg), and the second capacitor 4 constitute a second chopper circuit. Such a first chopper circuit and a second chopper circuit constitute a two-phase transformer circuit (multiphase transformer circuit) whose number of phases corresponds to two, and a plurality (two) of multiphase transformer circuits corresponding to the number of phases (that is, 2) are connected in parallel.

The primary voltage sensor 5 is a voltage sensor that detects a primary voltage V1 on the primary side, that is, the battery pack P side, of the step-up or step-down converter D1, and outputs the primary voltage V1 which is the state amount of the step-up or step-down converter D1 to the control drive circuit D3. This primary voltage V1 is an input voltage in a step-up operation of the step-up or step-down converter D1 and is an output voltage in a step-down operation of the step-up or step-down converter D1.

The secondary voltage sensor 6 is a voltage sensor that detects a secondary voltage V2 on the secondary side, that is, on a side of the inverter D2, of the step-up or step-down converter D1 and outputs the secondary voltage V2 that is a state amount of the step-up or step-down converter D1 to the control drive circuit D3. This secondary voltage V2 is an output voltage in a step-up operation of the step-up or step-down converter D1 and is an input voltage in a step-down operation of the step-up or step-down converter D1.

The current sensor 7 is a current sensor that detects a total amount (total current) of a primary current flowing through the primary winding 2*a* of the transformer 2 and a secondary current flowing through the secondary winding 2*b* as a reactor current I. This current sensor 7 outputs the reactor current I described above to the control drive circuit D3.

The primary current described above is an A-phase current Ia flowing through the primary winding 2*a* according to an on or off operation of the A-phase switching leg connected to the primary winding 2*a* and is a power current that flows from the primary side to the secondary side of the step-up or step-down converter D1 or a regenerative current that flows from the secondary side to the primary side of the step-up or step-down converter D1.

In addition, the secondary current is a B-phase current Ib that flows through the secondary winding 2*b* according to an on or off operation of the B-phase switching leg connected to the secondary winding 2*b*, and is a power current that flows from the primary side to the secondary side of the step-up or step-down converter D1 or a regenerative current that flows from the secondary side to the primary side of the step-up or step-down converter D1.

Here, as shown in FIG. 1, each of three-phase power lines connecting the inverter D2 and the traveling motor M is provided with a current sensor. That is, a U-phase power line is provided with a U-phase current sensor 8, a V-phase power line is provided with a V-phase current sensor 9, and a W-phase power line is provided with a W-phase current sensor 10.

The U-phase current sensor 8 detects a U-phase drive current or a U-phase regenerative current flowing through the U-phase power line, and outputs a U-phase current detection signal indicating a detected value thereof to the control drive circuit D3. The V-phase current sensor 9 detects a V-phase drive current or a V-phase regenerative current flowing through a V-phase power line, and outputs a V-phase current detection signal indicating a detected value thereof to the control drive circuit D3. Moreover, the W-phase current sensor 10 detects a W phase drive current or a W phase regenerative current flowing through a W-phase power line, and outputs a W phase current detection signal indicating a detected value thereof to the control drive circuit D3.

Next, details of the control drive circuit D3 will be described. This control drive circuit D3 includes a drift current detection unit 11, an average current detection unit 12, a control unit 13, and two gate signal generation units 14 and 15 as shown in FIG. 1.

The drift current detection unit 11 detects a drift current value H on the basis of a ripple component included in the reactor current I input from the current sensor 7. That is, this drift current detection unit 11 extracts the ripple component from the reactor current I, and outputs a difference between two peak values included in the ripple component to the control unit 13 as a drift current value H.

As described above, the reactor current I is a total current of the A-phase current Ia flowing through the primary winding 2*a* of the transformer 2 and the B-phase current Ib flowing through the secondary winding 2*b*. The A-phase current Ia is a DC current that includes ripples of a phase that is synchronized with the on or off operation of the A-phase switching leg, and the B-phase current Ib is a DC current that includes ripples of a phase that is synchronized with the on or off operation of the B-phase switching leg.

In addition, since the A-phase switching leg and the B-phase switching leg are turned on or off in opposite phases, a ripple component of the A-phase current Ia is in opposite phase to a ripple component of the B-phase current Ib.

When the A-phase switching leg and the B-phase switching leg in the step-up or step-down converter D1 are operating normally, that is, when the A-phase current Ia and the B-phase current Ib are approximately equal to each other, a ripple component of the reactor current I becomes a relatively small value due to a total (addition) of the ripple component of the A-phase current Ia and the ripple component of the B-phase current Ib.

In other words, when the A-phase switching leg and the B-phase switching leg in the step-up or step-down converter D1 are operating normally, a drift current value H, which is a difference between a peak value of the ripple component of the A-phase current Ia and a peak value of the ripple component of the B-phase current Ib is relatively small.

On the other hand, when any one of the A-phase switching leg and the B-phase switching leg reaches a failure state, a size of the A-phase current Ia and a size of the B-phase current I become different, so the drift current value H, which is the difference between the peak value of the ripple component of the A-phase current Ia and the peak value of the ripple component of the B-phase current Ib, is larger than that during a normal operation. Note that this is also described in Patent Document 1 described above.

In this manner, the drift current value H of the reactor current I can be said to be a state amount that changes depending on the ratio of the size of the A-phase current Ia and the size of B-phase current Ib, that is, a state amount indicating that one of the A-phase switching leg and the B-phase switching leg is in a failure state.

The average current detection unit 12 detects an average value (a current average value G) of the reactor current I on the basis of the reactor current I input from the current sensor 7. That is, this average current detection unit 12 performs moving average processing, which is a type of filter processing, on the reactor current I, and outputs a current value obtained by averaging the ripple component (the drift current) to the control unit 13 as a current average value G.

The control unit 13 generates first to fourth duty command values for voltage transformation necessary for generating first to fourth gate signals for voltage transformation on the basis of the primary voltage V1 input from the primary voltage sensor 5, the secondary voltage V2 input from the secondary voltage sensor 6, the reactor current I input from the current sensor 7, a control command input from a host control device, and the like.

These first to fourth duty command values for voltage transformation are signals that specify the duty ratio of the first to fourth gate signals for voltage transformation, which are PWM signals. The control unit 13 outputs the first to fourth duty command values for voltage transformation to the first gate signal generation unit 14.

The control unit 13 generates first to fourth traveling duty command values necessary for generating the first to fourth traveling gate signals on the basis of a secondary voltage V2 input from the secondary voltage sensor 6, a U-phase current detection signal input from the U-phase current sensor 8, a V-phase current detection signal input from the V-phase current sensor 9, a W-phase current detection signal input from the W phase current sensor 10, a control command input from the host control device, and the like.

These first to fourth traveling duty command values are signals that specify a duty ratio of the first to fourth traveling gate signals, which are PWM signals. The control unit 13 outputs the first to fourth traveling duty command values to the second gate signal generation unit 15.

Furthermore, the control unit 13 has a failure diagnosis function of the step-up or step-down converter D1. That is, this control unit 13 diagnoses whether any one of the A-phase switching leg or the B-phase switching leg is in a failure state on the basis of one of the drift current value H input from the drift current detection unit 11, the current average value G input from the average current detection unit 12, the voltage transformation ratio that is one of the operating states of the step-up or step-down converter D1, and the like.

Next, an operation of the power conversion device A according to the present embodiment will be described in detail with reference to FIGS. 2 and 3.

The control unit 13 generates the first to fourth duty command values for voltage transformation at each time by sequentially taking in the primary voltage V1, the secondary voltage V2, the reactor current I, the control command, and the like at a predetermined time interval, and outputs them to the step-up or step-down converter D1. In addition, the control unit 13 generates the first to sixth traveling duty command values at each time and outputs them to the inverter D2 by sequentially taking in the secondary voltage V2, the U-phase current detection signal, the V-phase current detection signal, the W-phase current detection signal, the control command, and the like at a predetermined time interval.

For example, when the traveling motor M is rotatably driven by causing the step-up or step-down converter D1 to perform a step-up operation and turning on the inverter D2, the control unit 13 generates the first to fourth duty command value for voltage transformation such that the step-up or step-down converter D1 has a predetermined step-up ratio, and generates the first to sixth traveling duty command values such that the inverter D2 converts the DC power input from the step-up or step-down converter D1 into three-phase AC power of a predetermined drive current value. As a result, the traveling motor M rotates at a torque and rotational speed specified by the control command and causes the electric vehicle to travel.

The first gate signal generation unit 14 generates the first to fourth gate signals for voltage transformation on the basis of the first to fourth duty command values for voltage transformation input from the control unit 13, and outputs them to the step-up or step-down converter D1. In addition, the second gate signal generation unit 15 generates the first to sixth traveling gate signals on the basis of the first to sixth traveling duty command values input from the control unit 13 and outputs them to the inverter D2.

Here, the first and second gate signals for voltage transformation that drive the first and second IGBTs for voltage transformation 3*a* and 3*b* constituting the A-phase switching leg are different in a phase from the third and fourth gate signals for voltage transformation that drive the third and fourth IGBTs for voltage transformation 3*c* and 3*d* constituting the B-phase switching leg by 180°. Therefore, the first and second IGBTs for voltage transformation 3*a* and 3*b* and the third and fourth IGBTs for voltage transformation 3*c* and 3*d* are turned on and off with their phases different by 180°.

As a result, the A-phase current Ia flowing through the primary winding 2*a* of the transformer 2 and the B-phase current Ib flowing through the secondary winding 2*b* of the transformer 2 have a relationship in which they are different in a phase of the ripple component by 180°. The current sensor 7 constantly detects the reactor current I, which is a total current of the A-phase current Ia and the B-phase current Ib, and outputs it to the drift current detection unit 11 and the average current detection unit 12.

Then, the drift current detection unit 11 sequentially detects the drift current value H on the basis of the reactor current I and outputs it to the control unit 13, and the average current detection unit 12 sequentially detects the current average value G on the basis of the reactor current I and outputs it to the control unit 13. Then, the control unit 13 diagnoses whether any one of the A-phase switching leg and the B-phase switching leg is in a failure state as follows on the basis of the drift current value H and the current average value G.

Figure 2:
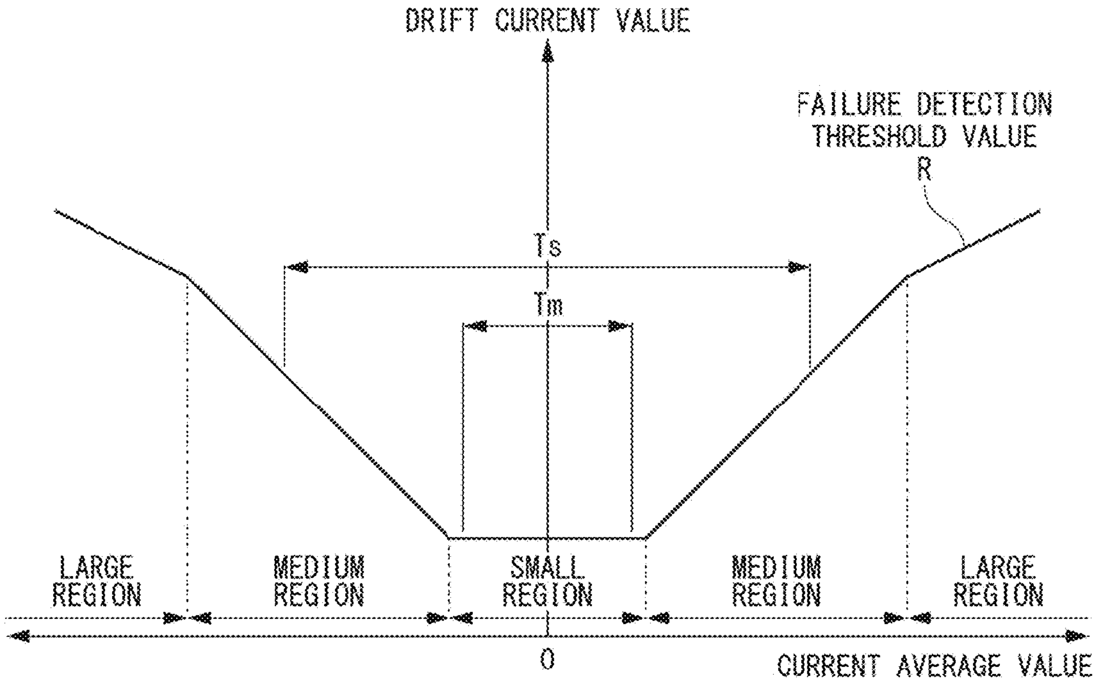
FIG. 2 is a characteristics diagram which shows a method of setting a failure detection threshold value R in the first embodiment of the present disclosure.

That is, the control unit 13 variably sets the failure detection threshold value R of the A-phase switching leg and the B-phase switching leg according to the drift current value H and the current average value G, as shown in FIG. 2. Then, when the drift current value H is equal to or greater than the failure detection threshold value R, the control unit 13 determines that any one of the A-phase switching leg or the B-phase switching leg is in a failure state, and determines that both the A-phase switching leg and the B-phase switching leg are normal when the drift current value H does not exceed the failure detection threshold value R.

Note that a horizontal axis in FIG. 2 shows the current average value G, but a flow direction of the reactor current I differs depending on whether the step-up or step-down converter D1 is performing a step-up operation or a step-down operation. As shown in FIG. 2, the failure detection threshold value R described above is set to be similarly with respect to two flow directions of the reactor current, that is, to be symmetrical with respect to a vertical axis (axis of the drift current value H) where the current average value G is "0."

In addition, as shown in FIG. 2, this failure detection threshold value R is set to a smaller value as a magnitude (absolute value) of current average value G decreases and is set to a larger value as the magnitude (absolute value) of the current average value G increases. For example, as shown in FIG. 2, the failure detection threshold value R is divided into three current regions: large, medium, and small (a large region, a medium region, and a small region) according to the magnitude of the current average value G, and is individually configured for each current range.

Figure 3:
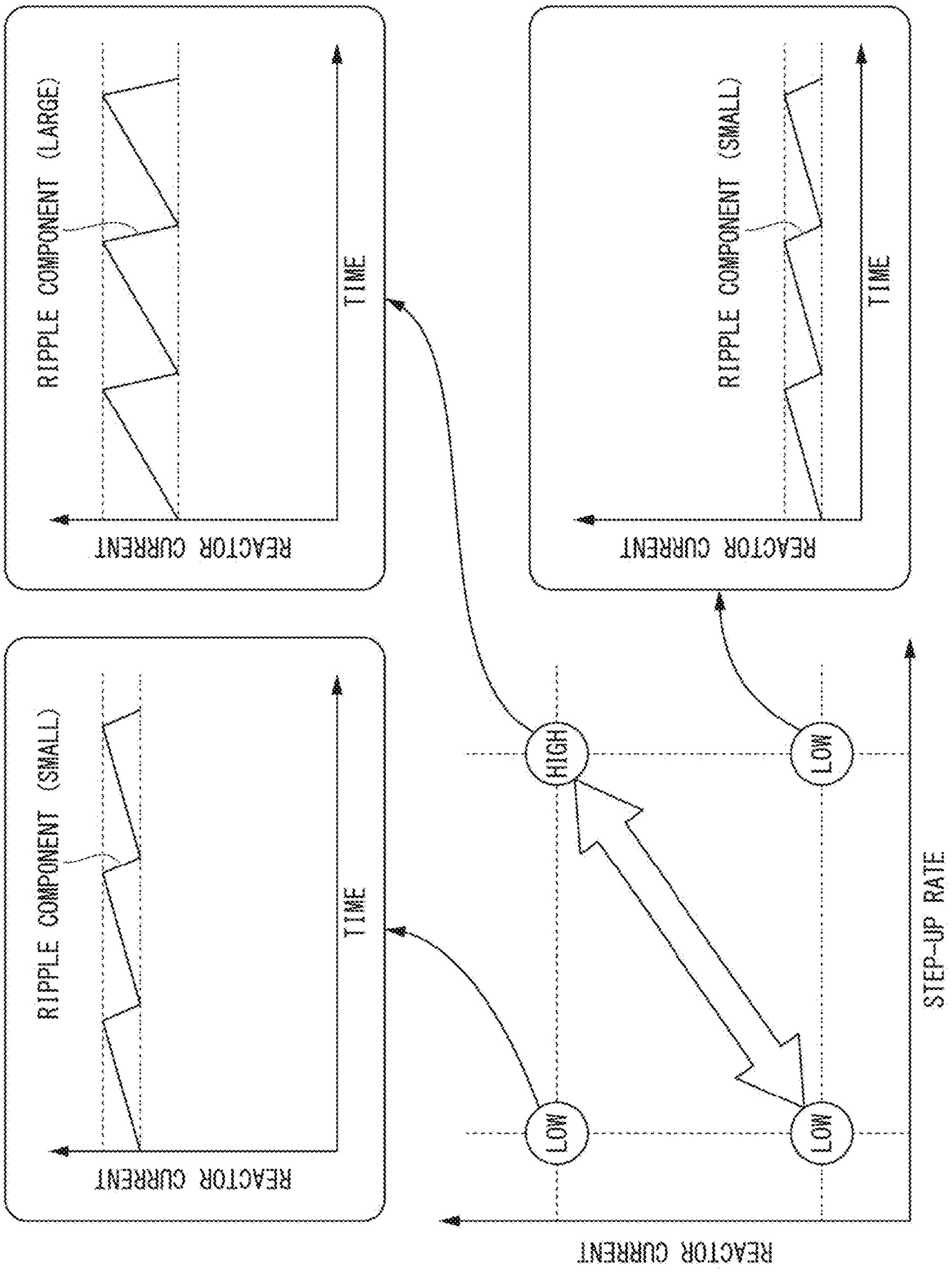
FIG. 3 is a schematic diagram which shows reliability of failure diagnosis according to a reactor current I, a drift current value H, and a step-up ratio in the first embodiment of the present disclosure.

It is because the ripple component of the reactor current I is smaller as the absolute value of the current average value G decreases, that is, as the reactor current I decreases when compared using the same step-up ratio in such a method of setting the failure detection threshold value R as shown in FIG. 3, so that reliability of failure determination of the A-phase switching leg or the B-phase switching leg decreases.

Note that, as shown in FIG. 3, the ripple component of the reactor current I becomes smaller as a step-up ratio S decreases when compared using the same reactor current I. That is, the reliability of failure determination of the A-phase switching leg or the B-phase switching leg tends to decrease as the step-up ratio S is smaller. When this is taken into consideration, the failure detection threshold value R may be set to a smaller value as the step-up ratio S decreases.

Here, the current average value G and the step-up ratio S in the first embodiment correspond to the state amount in the present disclosure. That is, the current average value G and the step-up ratio S are amounts indicating the operating state of the step-up or step-down converter D1.

Furthermore, when the reactor current I is small, that is, when the absolute value of the current average value G is small, there is concern that no significant difference will occur between the drift current value H when any one of the A-phase switching leg and the B-phase switching leg is in a failure state and the drift current value H when both the A-phase switching leg and the B-phase switching leg are normal.

When such a case is considered, regions in which failure diagnosis is not performed may be set for the current average value G, as shown as regions Tm and Ts in FIG. 2. Among these two regions Tm and Ts, a region Tm is set to a region smaller and narrower than a region Ts for the current average value G as shown in FIG. 2 and is a diagnostic non-execution area that is set in a case of the step-up ratio being medium or higher when it is divided into three areas: large, medium, and small.

On the other hand, it is assumed that the region Ts includes the region Tm for the current average value G and is set to a region wider than the region Tm and is a diagnostic non-execution region that is set when the step-up ratio is small. When the step-up ratio is small, the drift current value H tends to be smaller than when the step-up ratio is medium or higher. Therefore, when the step-up ratio is small, a diagnosis is stopped in a wider range of the current average value G than when the step-up ratio is medium or higher.

According to the first embodiment, the failure detection threshold value R is variably set according to the state amount of the first and second chopper circuits, and the drift current value H is compared with the failure detection threshold value R to determine a failure of the A-phase switching leg or B-phase switching leg that constitutes the first and second chopper circuits, so that it is possible to reduce the erroneous detection of failures in the A-phase switching leg and the B-phase switching leg compared with in the prior art.

Second Embodiment

Figure 4:
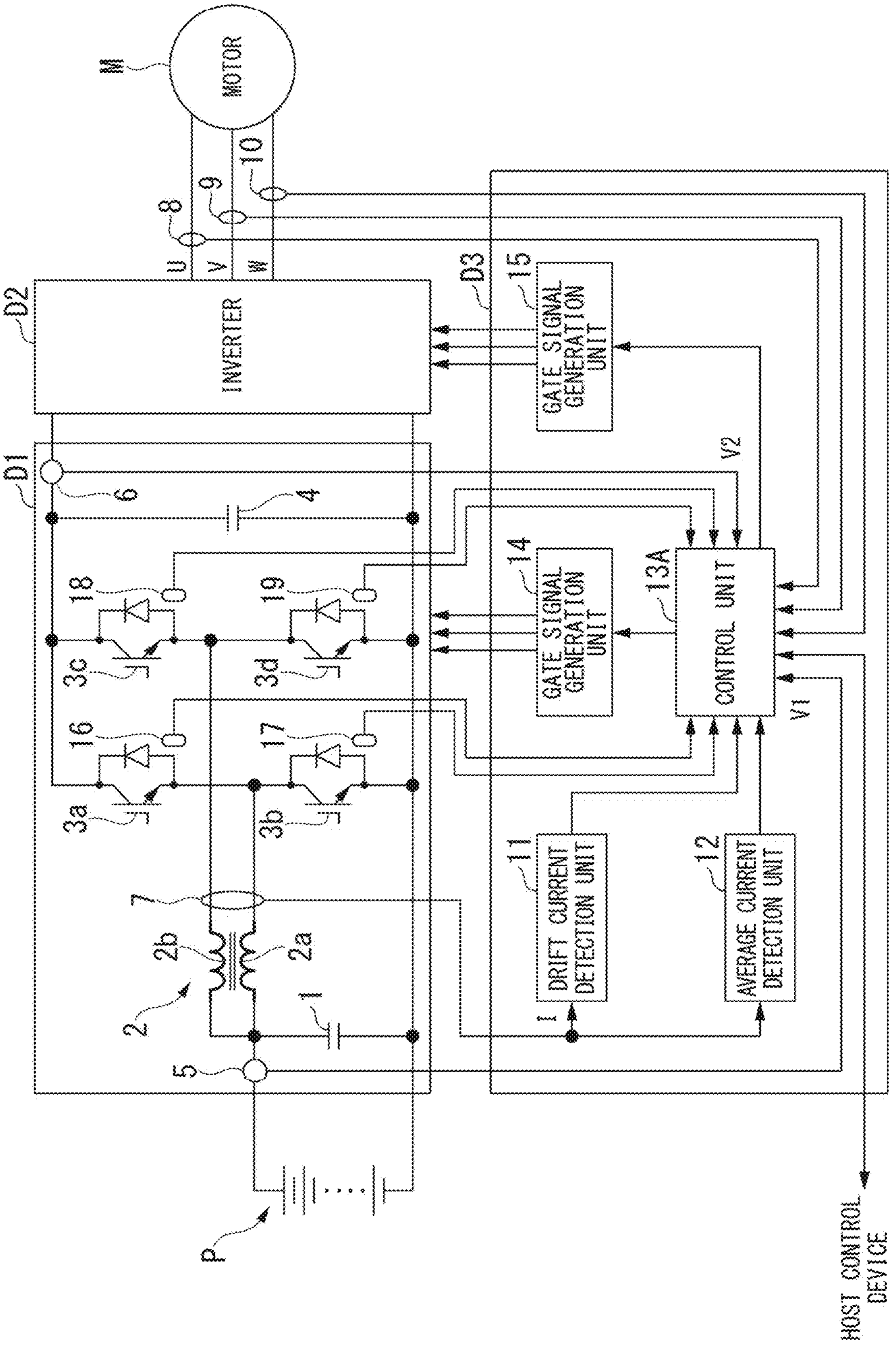
FIG. 4 is a block diagram which shows an overall configuration of a power conversion device A1 according to a second embodiment of the present disclosure.

Next, a second embodiment of the present disclosure will be described with reference to FIG. 4. FIG. 4 shows an overall configuration of the power conversion device A1 according to the second embodiment, and the same reference numerals will be attached to the same components as in FIG. 1 that shows an overall configuration of the power conversion device A according to the first embodiment.

As can be seen by comparing FIG. 4 with FIG. 1, the power conversion device A1 according to the second embodiment has four temperature sensors 16 to 19 added to the power conversion device A according to the first embodiment and includes a control unit 13A instead of the control unit 13 of the power conversion device A according to the first embodiment.

These four temperature sensors 16 to 19 and the control unit 13A constitute a failure identification unit of the present disclosure. Moreover, among the four temperature sensors 16 to 19 and the control unit 13A, the four temperature sensors 16 to 19 correspond to a temperature sensor of the present disclosure, and the control unit 13A corresponds to a determination unit of the present disclosure.

That is, the four temperature sensors 16 to 19 and the control unit 13A determine which switching leg has failed among an A-phase switching leg of the first chopper circuit and a B-phase switching leg of the second chopper circuit. Furthermore, the four temperature sensors 16 to 19 and the control unit 13A identify a failed switch (a semiconductor switching element) among an upper arm switch and a lower arm switch regarding a switching leg of the failed chopper circuit.

In addition, among the four temperature sensors 16 to 19 and the control unit 13A, the four temperature sensors 16 to 19 detect temperatures of the first to fourth IGBTs for voltage transformation 3*a* to 3*d* (semiconductor switching elements) constituting the first and second chopper circuits, respectively.

A first temperature sensor 16 is a sensor that detects an operating temperature of the first IGBT for voltage transformation 3*a*, and outputs the detected value as a first temperature detection signal to the control unit 13A. Moreover, a second temperature sensor 17 is a sensor that detects an operating temperature of the second IGBT for voltage transformation 3*b*, and outputs the detected value as a second temperature detection signal to the control unit 13A.

A third temperature sensor 18 is a sensor that detects an operating temperature of the third IGBT for voltage transformation 3*c*, and outputs the detected value as a third temperature detection signal to the control unit 13A. Furthermore, a fourth temperature sensor 19 is a sensor that detects an operating temperature of the fourth IGBT for voltage transformation 3*d*, and outputs the detected value as a fourth temperature detection signal to the control unit 13A.

On the other hand, the control unit 13A has a function of identifying a failed IGBT for voltage transformation in addition to the function of the control unit 13A of the first embodiment. This control unit 13A determines a failed semiconductor switching element, that is, one of the first to fourth IGBTs for voltage transformation 3*a* to 3*d*, on the basis of the detected values of the four (a plurality of) temperature sensors 16 to 19.

That is, when the control unit 13A determines the failure of the A-phase switching leg or B-phase switching leg by comparing the drift current value H with the failure detection threshold value R, the control unit 13A determines which of the two IGBTs for voltage transformation constituting the switching leg determined to be failed has failed on the basis of the first to fourth temperature detection signals, as post-processing.

For example, when the first IGBT for voltage transformation 3*a* constituting the A-phase switching leg has a failure (open failure) in which it is fixed in an off state (an open state), since the A-phase current Ia is no longer applied to the first IGBT for voltage transformation 3*a*, the operating temperature is significantly lower than normal. On the other hand, no major change occurs in the operating temperatures of the other second to fourth IGBTs for voltage transformation 3*b* to 3*d* that are not failed.

The control unit 13A identifies the failed IGBT for voltage transformation by evaluating the operating temperatures of the first to fourth IGBTs for voltage transformation 3*a* to 3*d* on the basis of the first to fourth temperature detection signals. Then, the control unit 13A notifies a host control device of the failed IGBT for voltage transformation.

According to the second embodiment, since it is possible to reduce the erroneous detection of failures in the A-phase switching leg and the B-phase switching leg compared with in the prior art, and to identify a failed IGBT for voltage transformation as in the first embodiment, the step-up or step-down converter D1 can be easily repaired.

Note that the present disclosure is not limited to each embodiment described above, and, for example, modifications as follows may be considered.

(1) In each of the embodiments described above, the current average value G is used as the state amount indicating the operating states of the first and second chopper circuits, but the present disclosure is not limited thereto. Instead of or in addition to the current average value G, that is, an average value of the reactor current I, an effective value, or a voltage transformation ratio (a step-up ratio or a step-down ratio) of the reactor current I may be used as the state amount of the second chopper circuit and the failure detection threshold value R may be variably set according to the state amount.

(2) In each of the embodiments described above, the current average value G generated by the average current detection unit 12 is defined as the state amount, but the present disclosure is not limited thereto. For example, a current sensor (second current sensor) that detects an input current of the step-up or step-down converter D1 during a step-up operation, that is, an output current (battery current) of the battery pack P may be separately provided and the detected value of the second current sensor may be used as the state amount. Since the ripple component of the battery current is sufficiently smaller than that of the reactor current I, it can be employed as the state amount for variably setting the failure detection threshold value R.

In addition, a current sensor (second current sensor) that detects an output current of the step-up or step-down converter D1 during a step-up operation, that is, an input current of the inverter D2 may be separately provided and the detected value of the second current sensor may be used as the state amount. Since the ripple component of the output current described above is sufficiently smaller than that of the reactor current I, it can be employed as the state amount for variably setting the failure detection threshold value R.

(3) In each of the embodiments described above, the current sensor 7 that detects a total amount of a primary current flowing through the primary winding 2*a* of the transformer 2, that is, the A-phase current Ia flowing through the A-phase switching leg, and a secondary current flowing through the secondary winding 2*b*, that is, the B-phase current Ib flowing through the B-phase switching leg is employed. That is, this current sensor 7 detects a composite current of two phase currents called the A-phase current Ia and the B-phase current Ib as the reactor current I. However, the current sensor in this disclosure is not limited to the current sensor 7. For example, two current sensors that individually detect the A-phase current Ia and the B-phase current Ib may also be employed.

(4) In each of the embodiments described above, a case has been described in which the present disclosure is applied to a two-phase transformer circuit, but the present disclosure is not limited thereto. That is, the present disclosure can be applied to multiphase transformer circuits other than two-phase transformer circuits, such as three-phase transformer circuits, four-phase transformer circuits, and even transformer circuits with a five-phase configuration or more.

(5) In each of the embodiments described above, a case has been described in which the present disclosure is applied to the step-up or step-down converter D1 (multiphase transformer circuit) that employs an IGBT as a semiconductor switching element, but the present disclosure is not limited thereto. The present disclosure is also applicable to multiphase transformer circuits that employ semiconductor switching elements other than IGBTs, such as MOS transistors.

(6) In each of the embodiments described above, a case has been described in which the present disclosure is applied to the step-up or step-down converter D1, which is a type of the multiphase transformer circuit, but the present disclosure is not limited thereto. The present disclosure can also be applied to a multiphase step-up circuit that performs only a step-up operation and a multi-phase step-down circuit that only performs a step-down operation.

INDUSTRIAL APPLICABILITY

The present disclosure can be used for power conversion devices.

REFERENCE SIGNS LIST

A, A1 Power conversion device
D1 Step-up or step-down converter
D2 Inverter
D3 Control drive circuit
1 First capacitor
2 Transformer
2*a* Primary winding
2*b* Secondary winding
3*a* to 3*d* IGBT for voltage transformation
4 Second capacitor
5 Primary voltage sensor
6 Secondary voltage sensor
7 Current sensor
8 U-phase current sensor
9 V-phase current sensor
10 W phase current sensor
11 Drift current detection unit
12 Average current detection unit
13 Control unit
14, 15 Gate signal generation unit

The invention claimed is:

1. A power conversion device comprising:
a multiphase transformer circuit in which a plurality of chopper circuits are connected in parallel according to the number of phases;
a current sensor configured to detect a phase current of the chopper circuit;
a drift current detection unit configured to detect a drift current value of the phase current; and
a failure determination unit configured to variably set a failure detection threshold value according to a state amount of the multiphase transformer circuit and to determine a failure of the chopper circuit by comparing the drift current value of the chopper circuit with the failure detection threshold value.

2. The power conversion device according to claim 1,
wherein the current sensor detects a total amount of the phase current, and
the failure determination unit sets the failure detection threshold value on the basis of the state amount obtained from the total amount.

3. The power conversion device according to claim 1, further comprising:
a second current sensor configured to detect an input current or output current of the multiphase transformer circuit in addition to the current sensor,
wherein the failure determination unit sets the failure detection threshold value on the basis of a detection value of the second current sensor.

4. The power conversion device according to claim 1,
wherein the failure determination unit divides a current range into a plurality of current ranges according to a size of the state amount and sets the failure detection threshold value for each division.

5. The power conversion device according to claim 1, further comprising:
a failure identification unit configured to identify the chopper circuit with failure.

6. The power conversion device according to claim 5,
wherein the failure identification unit includes
a plurality of temperature sensors that each detect a temperature of a semiconductor switching element constituting the chopper circuit, and
a determination unit configured to determine the semiconductor switching element with failure on the basis of a detection value of the temperature sensor.

7. The power conversion device according to claim 1,
wherein the failure determination unit sets the failure detection threshold value to be smaller as the state amount decreases.

8. The power conversion device according to claim 1,
wherein the state amount is an average value or an effective value of the phase current.

9. The power conversion device according to claim 1, wherein the state amount is a voltage transformation ratio of the multiphase transformer circuit.

10. The power conversion device according to claim 1, wherein the multiphase transformer circuit is a step-up or step-down conversion circuit with a multiphase configuration.

* * * * *